(12) United States Patent
Wei et al.

(10) Patent No.: US 10,718,833 B2
(45) Date of Patent: Jul. 21, 2020

(54) MAGNET FOR HEAD EXTREMITY IMAGING

(71) Applicant: Magnetica Limited, Eagle Farm (AU)

(72) Inventors: Riyu Wei, Forest Lake (AU); Feng Liu, Forest Lake (AU); Stuart Crozier, Wilston (AU)

(73) Assignee: Magnetica Limited, Eagle Farm (AU)

( * ) Notice: Subject to any disclaimer, the term of this patent is extended or adjusted under 35 U.S.C. 154(b) by 688 days.

(21) Appl. No.: 15/503,244

(22) PCT Filed: Aug. 18, 2015

(86) PCT No.: PCT/AU2015/050469
§ 371 (c)(1),
(2) Date: Feb. 10, 2017

(87) PCT Pub. No.: WO2016/025996
PCT Pub. Date: Feb. 25, 2016

(65) Prior Publication Data
US 2017/0242084 A1    Aug. 24, 2017

(30) Foreign Application Priority Data
Aug. 18, 2014  (AU) ................................ 2014903209

(51) Int. Cl.
*G01R 33/3815* (2006.01)
*G01R 33/421* (2006.01)
(Continued)

(52) U.S. Cl.
CPC ....... *G01R 33/3815* (2013.01); *G01R 33/385* (2013.01); *G01R 33/421* (2013.01); *H01F 6/06* (2013.01)

(58) Field of Classification Search
CPC .............. G01R 33/3815; G01R 33/385; G01R 33/421; G01R 33/3802; G01R 33/38; H01F 6/06
See application file for complete search history.

(56) References Cited

U.S. PATENT DOCUMENTS 5,307,039 A   4/1994  Chari et al.
5,396,207 A   3/1995  Dorri et al.
(Continued)

FOREIGN PATENT DOCUMENTS

CN   102667517   9/2012
JP   H0819525    1/1996

*Primary Examiner* — Rishi R Patel
(74) *Attorney, Agent, or Firm* — Boyle Fredrickson S.C.

(57) ABSTRACT

A magnetic resonance imaging (MRI) system uses a superconducting magnet having a primary coil structure and a shielding coil layer. The primary coil structure comprises at least three sets of coils with significantly different inner diameters, forming a three-bore magnet structure. The three bores are coaxially aligned with a longitudinal axis, with the largest diameter first bore on one side of the magnet and the smallest diameter third bore on another side of the magnet, as well as a medium diameter second bore located axially between the first and the third bores. The first bore allows access for the head and shoulders and permits the head to enter into the second bore for imaging, while the patient's extremities (hands, legs) may access through the third bore for producing images of the extremity joints. The magnet may also be used for other specialist imaging where use of a whole-body MRI is unwarranted, such as the imaging of neonates. Reinforcing plates can be connected between coil formers to withstand the forces generated by the high magnetic fields.

20 Claims, 14 Drawing Sheets

(51) Int. Cl.
*H01F 6/06* (2006.01)
*G01R 33/385* (2006.01)

(56) References Cited

U.S. PATENT DOCUMENTS

| | | |
|---|---|---|
| 5,416,415 A | 5/1995 | Dorri et al. |
| 5,646,532 A | 7/1997 | Knuttel et al. |
| 5,801,609 A | 9/1998 | Laskaris et al. |
| 5,818,319 A | 10/1998 | Crozier et al. |
| 6,140,900 A | 10/2000 | Crozier et al. |
| 6,700,468 B2 | 3/2004 | Crozier et al. |
| 7,375,528 B2 | 5/2008 | Crozier et al. |
| 7,498,810 B2 | 3/2009 | Lvovsky et al. |
| 2004/0251901 A1* | 12/2004 | Tsuda ................ G01R 33/3806 324/318 |
| 2006/0055406 A1* | 3/2006 | Lvovsky ............. G01R 33/381 324/318 |
| 2010/0079144 A1* | 4/2010 | Crozier .............. G01R 33/3815 324/319 |

\* cited by examiner

Known Head Magnet

Present Head-Extremity Magnet

|B| (T)

|B| (T)

Force (N)

MAGNET FOR HEAD EXTREMITY IMAGING

FIELD OF THE INVENTION

The present invention relates to compact, shielded asymmetric superconducting magnets for producing homogeneous magnetic fields ($B_0$ fields) for use in specialist magnetic resonance imaging (MRI) applications. The magnets have portions of different bore diameter and are configured for producing images of the head and extremity joints of a subject, as well as neonatal images, in an inexpensive manner.

BACKGROUND OF THE INVENTION

Magnetic resonance imaging was introduced in the 1980s, and has developed into a major global imaging modality.

Clinical MRI depends for its success on the generation of strong and pure magnetic fields. A major specification of the static field in MRI is that it has to be substantially homogeneous over a predetermined region, known in the art as the "diameter spherical imaging volume" or "dsv". Errors less than 20 parts per million peak-to-peak (or 10 parts per million rms) are typically required for the dsv.

MRI equipment has undergone a number of refinements since the introduction of the first closed cylindrical systems. In particular, improvements have occurred in quality/resolution of images through improved signal to noise ratios and introduction of high and ultra high field magnets. Improved resolution of images, in turn, has led to MRI being a preferred choice for for both structural anatomical and functional human MRI imaging.

The basic components of a typical magnetic resonance system for producing diagnostic images for human studies include a main magnet (usually a superconducting magnet which produces the substantially homogeneous magnetic field (the $B_0$ field) in the dsv), one or more sets of shim coils, a set of gradient coils, and one or more RF coils. Discussions of MRI, can be found in, for example, Haacke et al., *Magnetic Resonance Imaging: Physical Principles and Sequence Design*, John Wiley & Sons, Inc., New York, 1999. See also Crozier et al U.S. Pat. Nos. 5,818,319, 6,140,900 and 6,700,468, Dorri et al U.S. Pat. Nos. 5,396,207 and 5,416,415, Knuttel et al U.S. Pat. No. 5,646,532, and Laskaris et al U.S. Pat. No. 5,801,609, the disclosures of which are incorporated herein in their entireties.

Whole body MRI magnets are typically around 1.6-2.0 meters in length with apertures in the range of 0.6-0.8 meters. Normally the magnet is symmetric such that the midpoint of the dsv is located at the geometric center of the magnet's structure along its main axis. Not surprisingly, many people suffer from claustrophobia when placed in such a space. Moreover, the large distance between the portion of the subject's body which is being imaged and the end of the magnet system means that physicians cannot easily assist or personally monitor a subject during an MRI procedure.

In addition to its effects on the subject, the size of the magnet is a primary factor in determining the cost of an MRI machine, as well as the costs involved in the siting of such a machine. Another important consideration is the volume of helium needed to maintain the system at cryogenic temperatures. Due to their large size, such whole body magnets are expensive for use in producing images of small sizes of objects, such as, heads, extremities and neonates, etc.

Known superconductive head magnets includes those disclosed in U.S. Pat. Nos. 5,396,207 and 5,416,415 issued to Dorri et al, as well as U.S. Pat. No. 5,801,609 issued to Laskaris et al. Those magnets have limited applications and are mostly suitable for brain imaging. They are not useful for extremity imaging such as the imaging of knee joints as the joint cannot reach to the imaging zone for most patients due to the long distance to the dsv from the end and the difficulty of placing and accommodating the other leg, for example.

Frusto-conical magnets for MRI are disclosed in U.S. Pat. Nos. 5,307,039 and 7,498,810. However, the magnet of U.S. Pat. No. 5,307,039 still has the disadvantages of being a relatively large magnet but only produces a field strength of around 0.5 T. While the magnet of U.S. Pat. No. 7,498,810 is smaller, and provides access from both ends, its configuration is particularly suited for extremity imaging rather than imaging of human heads.

The present invention aims to provide relatively small and therefore inexpensive magnets and magnetic resonance systems for imaging of human heads, extremities as well as neonates, etc.

SUMMARY OF THE INVENTION

In one form, the present invention provides a compact superconducting magnet suitable for use in a MRI system for imaging of the human head, extremities and neonates, etc.

The magnet has a bore extending along an axis of the magnet and is capable of producing a magnetic field of at least 1.5 Tesla in an imaging region within the bore.

The magnet comprises a primary coil structure or arrangement having at least first, second and third sets of coils positioned along the axis and coaxially aligned along the axis, each set having one or more primary coils arranged around the bore and each set of coils having a different inner diameter to the other sets.

A primary coil in the first set is located adjacent to a first axial end of the magnet, a primary coil in the third set is located adjacent to a second axial end of the magnet being opposite to the first axial end, and the second set is located between the first and third sets of primary coils. The inner diameter of the or each coil of the second set is less the inner diameter of the or each coil of the first set but greater than the inner diameter of the or each coil of the third set.

An advantage of having a stepped diameter or 'multi-bore' magnet configuration is that the dsv is close enough to the smaller bore side for extremity access while maintaining suitable shoulder access from the other side. Thus, the versatile stepped-diameter magnet systems of the invention allow the head and the shoulder access to the dsv from the larger bore side and extremity/limb access to the dsv from the smaller bore side.

Preferably, the outer diameter of the or each coil of the second set is less than the or each coil of the first set but greater than the or each coil of the third set.

Preferably, the total length of the second and third sets of coils along the axis is less half the length of first set of coils along the axis, and the length of the third set of coils along the axis is less than the length of the second set of coils along the axis.

The magnet is typically provided with a primary coil former having at least three former portions or segments, for the respective coil sets. Each of the first, second and third sets of coils are arranged on first, second and third former portions or segments, respectively, surrounding the bore. The inner diameter of the first former segment (which has the first coil set thereon) is larger than the average inner diameter of the second former segment (which has the second coil set thereon) which, in turn, is larger than the inner diameter of the third former segment (which has the third coil set thereon). Preferably, the outer diameter of the first former segment is larger than the average outer diameter of the second former segment which, in turn, is larger than the outer diameter of the third former segment.

Preferably two coils of the first set are wound respectively around two opposed axial end portions of the first former segment, while preferably two coils of the second set are wound around two opposed axial end portions of the second former segment, and at least one coil of the third set is wound around the third former segment.

The first and third former segments are preferably cylindrically shaped. The second former may be either cylindrically shaped or of conical or frusto-conical shape.

The former defines a stepped diameter bore. A two-part gradient coil may be provided for the magnet, with the first part of the gradient coil being of a first diameter and located within the first former portion, and a second part of the gradient coil being of a second diameter and located within the second former portion, the first diameter being greater than the second diameter.

In an embodiment, the inner diameter of first coil set is larger than 80 cm and less than 110 cm, and the inner diameter of third coil set is less than 40 cm. The ratio of the inner diameter of first coil set to the inner diameter of third coil set is greater than 2, and preferably greater than 3.

The magnet preferably has a cold bore axial length less than 100 cm, and the dimension of the imaging region along the axial direction is preferably at least 20 cm.

A shielding coil structure is preferably provided radially around the primary coil structure, extending approximately the axial length of the first former portion of the magnet. The shielding coil structure may have its own former, and has at least one shielding coil of greater diameter than the primary coils. Typically, the shielding coil has opposite current polarity to the majority of the primary coils.

Preferably, force balancing is used in the design of the magnet to minimize the net forces on the coils. In implementing the step of force balancing, Maxwell forces are included in the error function to be minimized.

In an embodiment, a plurality of circumferentially-spaced first reinforcing portions, such as plate members, are attached to the second former segment and extend to the top part of the right end of first former segment, and a plurality of circumferentially-spaced second reinforcing portions, such as plate members, are attached to the third former segment and extend to the top part of the right end of second former segment. The plate members may be triangular in shape, and are used to withstand the axial electromagnetic forces and bending moments exerted by the coils on the second and third former segments. Spaced plates may also be attached to the first former segment and extend to the shield former, depending on the magnet design requirements.

The magnet may be provided with an outer vacuum chamber formed between a larger diameter cylindrically-shaped portion and a smaller diameter conical or frusto-conical shaped portion.

The magnet is particularly suitable for use in imaging of adult body parts (such as head, extremity) and baby, animal and other small sized objects.

In another form, the invention provides a magnetic resonance imaging system having a magnet as described above.

The above summary of the invention and certain embodiments are only for the convenience of the reader and are not intended to and should not be interpreted as limiting the scope of the invention. More generally, it is to be understood that both the foregoing general description and the following detailed description are merely exemplary of the invention, and are intended to provide an overview or framework for understanding the nature and character of the invention as it is claimed.

Additional features and advantages of the invention are set forth in the detailed description which follows. Both these additional features of the invention and those discussed above can be used separately or in any and all combinations.

The accompanying drawings are included to provide a further understanding of the invention, and are incorporated in and constitute a part of this specification. The drawings illustrate, by way of example, various embodiments of the invention, and together with the description serve to explain the principles and operation of the invention. In the drawings and the specification, like parts in related figures are identified by like numbers.

DETAILED DESCRIPTION OF EMBODIMENTS OF THE INVENTION

Figure 1:
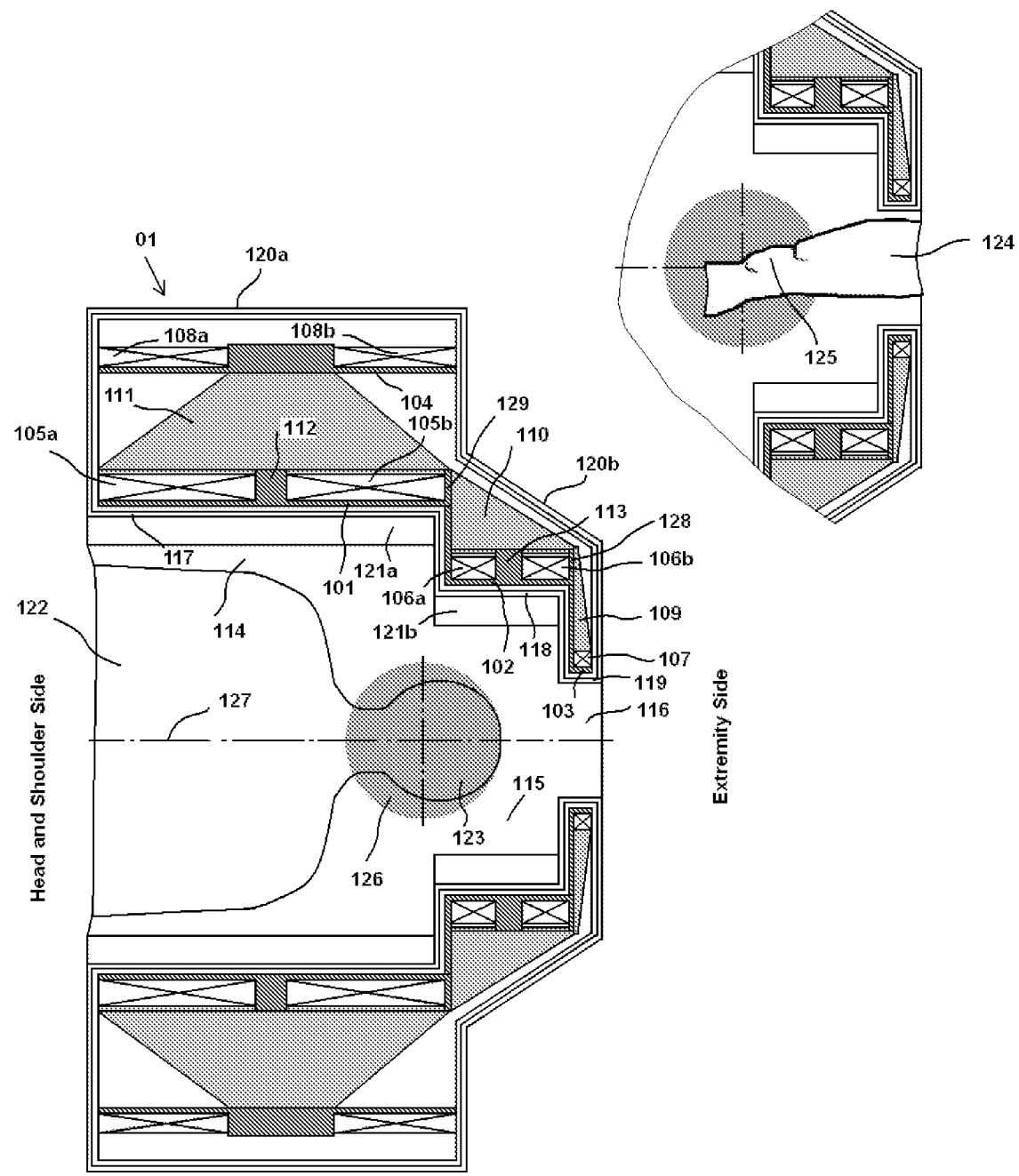
FIG. 1 is a schematic cross-sectional view of a first embodiment of the present invention.

A superconducting magnet typically has a primary coil structure comprising an arrangement of coils. The primary coil structure is surrounded by a shielding coil structure or layer, also made up of an arrangement of one or more coils. In its preferred embodiments, the present invention provides magnetic resonance systems having a primary coil structure comprising at least three sets or steps of coils with significantly different inner diameters. The coils are illustrated schematically in the drawings.

Figure 2:
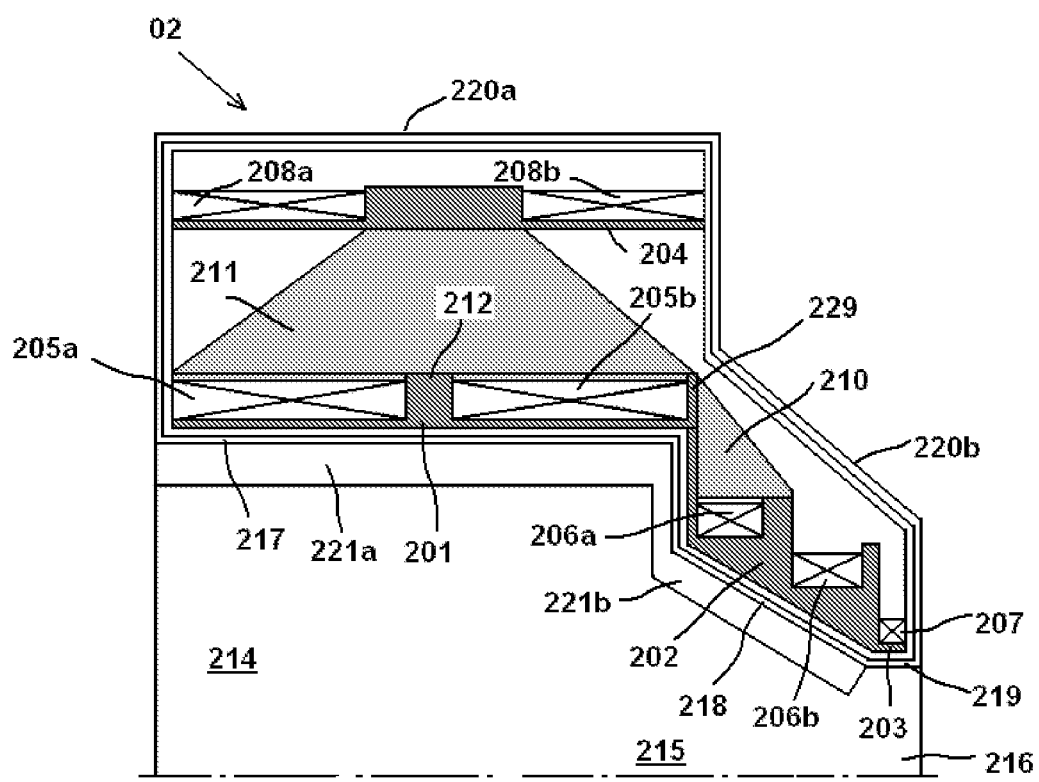
FIG. 2 is a schematic cross-sectional view of a second embodiment of the present invention.

As illustrated in the embodiments of FIGS. 1 and 2, in the primary coil structure of the magnet, there are three former segments of different inner diameters or bores, on which coils are wound. These three former segments are connected each after another to construct a three-bore magnet structure aligned coaxially with a longitudinal axis. The bore having the largest diameter is on one side of the magnet allowing access of human head and shoulders, while the bore having the smallest diameter is on another side of the magnet allowing access of human extremities (hands and legs), with the medium sized bore is located between the largest and the smallest bores. Materials of the three former segments can be either metal such as, but not limited to, non-magnetic stainless steel, or non-metal such as, glass fibre reinforced polymer (GFRP).

FIG. 1 shows a first preferred embodiment of the magnet 01 of the present invention. Two (but not limited to two) superconductive primary coils 105a and 105b having the same or similar inner diameters are wound around a cylindrically-shaped first former segment 101, the coils being on opposed sides or ends of the segment 101 and separated by a middle part 112 of the former segment 101. Similarly two (but not limited to two) other primary superconductive coils 106a and 106b having the same or similar inner diameters are wound around a cylindrically-shaped second former segment 102, the coils being on opposed sides or ends of the segment separated by a middle part 113 of the former segment 102. A single superconductive primary coil 107 is wound around the cylindrically-shaped third former segment 103.

Two (but not limited to two) superconductive shielding coils 108a and 108b, having opposite current polarity to the majority of the primary coils, are wound around the shield former 104, so as to reduce stray magnetic field. The total length of the shield coils is approximately the axial length of the first former segment 101.

At field strengths of 1.5 Tesla or over, very large axial electromagnetic forces are generated in the primary superconductive coils, causing very large bending moments as the electromagnetic forces push the left-most coil on the segment 101 to the right and push the other coils, especially those coils on the smaller-diameter former segments 102 and 103, to the left. In order to support or withstand the axial forces and bending moments, a plurality of circumferentially-spaced apart reinforcing portions, typically triangular plate members 109, are attached to the third former segment 103 and extend radially to the top part of the right end 128 of the second former segment 102, and a plurality of circumferentially-spaced apart reinforcing portions, typically triangular plate members 110, are attached to the second former segment 102 and extend radially to the top part of the right end 129 of the first former segment 101. Depending on the values of axial forces in the primary coils 105a and 105b as well as in the shield coils 108a and 108b, a plurality of circumferentially-spaced apart reinforcing portions, typically plate members 111, may be applied to connect both ends and the middle part 112 of the first former segment 101, or connect the right end 129 and the middle part 112 of the first former segment 101, and preferably extend radially to support the shield former 104.

The magnet 01 has a largest-diameter first bore 114 defined by the diameter of the inside vacuum chamber 117 which is proximate the first former segment 101, and has a medium-diameter second bore 115 defined by the diameter of the inside vacuum chamber 118 which is proximate the second former segment 102, and has a smallest-diameter third bore 116 defined by the diameter of the inside vacuum chamber 119 which is proximate the third former segment 103. The magnet 01 includes an outer vacuum chamber having a cylindrically-shaped portion 120a and a conical or frusto-conical shaped portion 120b. The magnet 01 also includes a two-step gradient coil with the first-step gradient coil 121a disposed in the first bore 114 and the second-step gradient coil 121b disposed in the second bore 115.

Although the magnet 01 may be used for other applications, such as neonatal imaging, it is specifically designed for imaging of the human head and the extremities and generates a magnetic field strength of at least 1.5 Tesla within the diameter of spherical volume ('dsv') 126 which is located in the first and second bores 114 and 115 and which is centred along the longitudinally extending axis 127. The first and second bores 114 and 115 are preferably sized such that the patient's shoulders 122 fit inside the first bore 114 with the patient's head 123 partially extending into the second bore 115 and such that the diameter of the second bore 115 is smaller than the width of the patient's shoulders 122. The third bore 116 is preferably sized such that the patient's extremity 124, such as a leg, fits inside the third bore 116. The lengths of the second and third bores 115 and 116 are appropriately designed such that the joint 125 of the patient's extremity is within the dsv 126. The conical or frusto-conical portion 120b of the outer vacuum chamber is preferably designed to provide a comfortable location or resting place for a patient's leg when imaging the other leg.

FIG. 2 shows a second preferred embodiment of the magnet 02 of the present invention. Two (but not limited to two) superconductive primary coils 205a and 205b having the same or similar inner diameters are wound around a cylindrically-shaped first former segment 201, the coils being on opposed sides or ends of the segment separated by a middle part 212 of the former segment 201. Two (but not limited to two) other superconductive coils 206a and 206b, one of which has larger inner diameter than the inner diameter of another coil, are wound around the conical or frusto-conical shaped second former segment 202, one of coils being on the top end of the former segment 202 and another being on the bottom end of the former segment 202. A single superconductive coil 207 is wound around a cylindrically-shaped third former segment 203.

In addition to the primary coils, two (but not limited to two) superconductive shielding coils 208a and 208b having opposite current polarity to the majority of the primary coils, are wound around the shield former 204, so as to reduce stray magnetic field. The total length of the shield coils is approximately the axial length of the first former segment 201.

At field strengths of 1.5 Tesla or over, very large axial electromagnetic forces are generated in the primary superconductive coils, causing very large bending moments as the electromagnetic forces push the left-most coil on the segment 201 to the right and push the other coils, especially those coils on the smaller-diameter former segments 202 and 203, to the left. In order to support or withstand the axial forces and bending moments, a plurality of circumferentially-spaced triangular plate members 210 are attached to the second former segment 202 portion on which the coil 206a is wound and extend radially to the top part of the right end 229 of first former segment 201. Depending on the values of axial forces in the primary coils 205a and 205b as well as in the shield coils 208a and 208b, a plurality of circumferentially-spaced plate members 211 may be applied to connect both ends and the middle part 212 of first former segment 201, or connect the right end 229 and the middle part 212 of the first former segment 201, and preferably extend radially to support the shield former 204.

The magnet 02 has a largest-diameter cylindrically-shaped first bore 214 defined by the diameter of the inside vacuum chamber 217 which is proximate the first former segment 201, and has a medium average-diameter conical or frusto-conical shaped second bore 215 defined by two end diameters of the inside vacuum chamber 218 which is proximate the conical or frusto-conical shaped second former segment 202, and has a smallest-diameter third bore 216 defined by the diameter of the inside vacuum chamber 219 which is proximate the third former segment 203. The magnet 02 includes an outer vacuum chamber having a cylindrical-shaped portion 220a and a conical or frusto-conical shaped portion 220b which is preferably designed to provide a comfortable location or resting place for a patient's leg when imaging the other leg. The magnet 02 also includes a two-step gradient coil with the first-step cylindrically-shaped gradient coil 221a disposed in the first bore 214 and the second-step conical or frusto-conical shaped gradient coil 221b disposed in the second bore 215.

Figure 3:
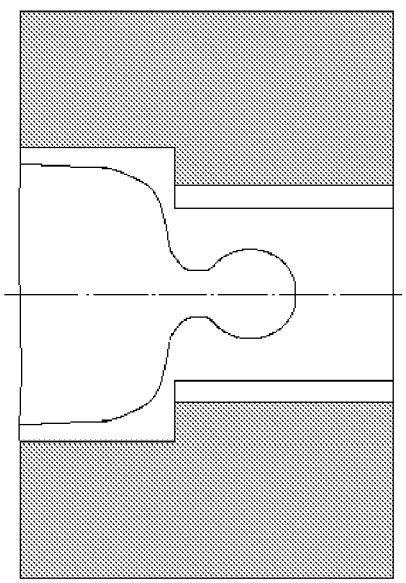
FIG. 3 illustrates the differences between a head-extremity magnet of an embodiment of the present invention and a known head magnet.
Figure 3:
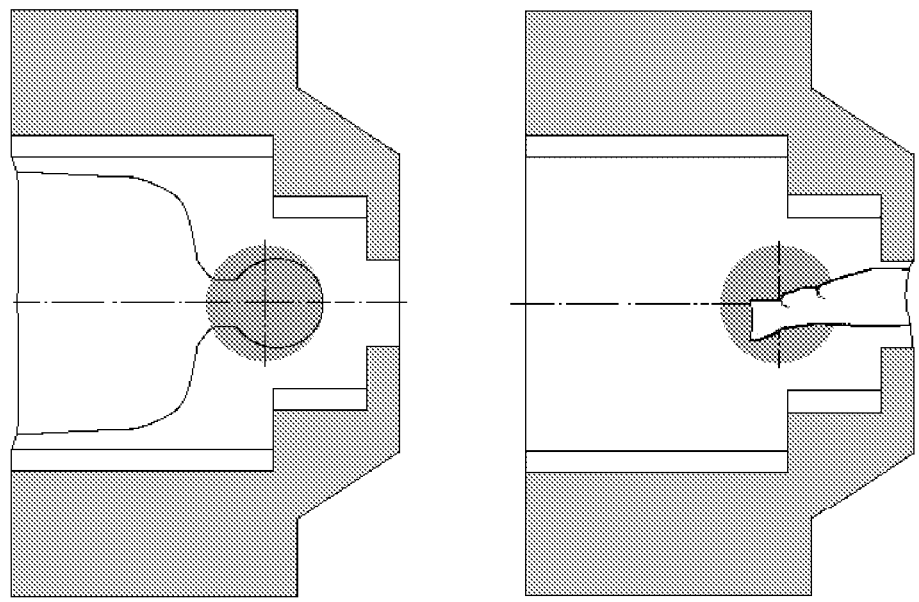

Compared to the known superconductive head magnets (see FIG. 3), the illustrated embodiments of the present invention
(1) provide a three-bore magnet with a novel coil and support structure which allows access for the human head and shoulders from the largest bore for imaging, and access for the extremities from the smallest bore for imaging;
(2) use a two-step gradient coil to produce required gradient magnetic field; and
(3) have an outer vacuum chamber comprising two portions: a larger diameter cylindrically-shaped portion and a smaller diameter conical or frusto-conical shaped portion.

In the preferred embodiments of the invention, the magnets achieve some and, most preferably, all of the following performance criteria:
(1) an outer shield coil radius that is less than or equal to 85 cm, and preferably less than or equal to 75 cm,
(2) an overall cold bore length that is less than or equal to 100 cm,
(3) sufficiently large dsv size of at least 30 cm(d)×30 cm(z) with a homogeneity of +/−10 ppm after shimming,
(3 sufficient spacing between coils to allow effective cryogenic cooling,
(4) low peak magnetic fields within the coils to allow for the use of less expensive superconducting wire (e.g. a calculated peak magnetic field within any of the plurality of current carrying coils whose magnitude is less than approximately 7.5 Tesla), and
(5) low stray fields (e.g. a calculated stray magnetic field external to the magnet that is less than $5 \times 10^{-4}$ Tesla at all locations greater than 4 meters from the dsv geometrical centre), and
(6) low stress values with the hoop stresses less than or equal to 100 MPa.

Examples of the magnets of the invention, and the procedures used in determining the coil configurations and current distribution functions of the magnets, will now be more fully described, without limiting the scope of the invention.

Figure 4:
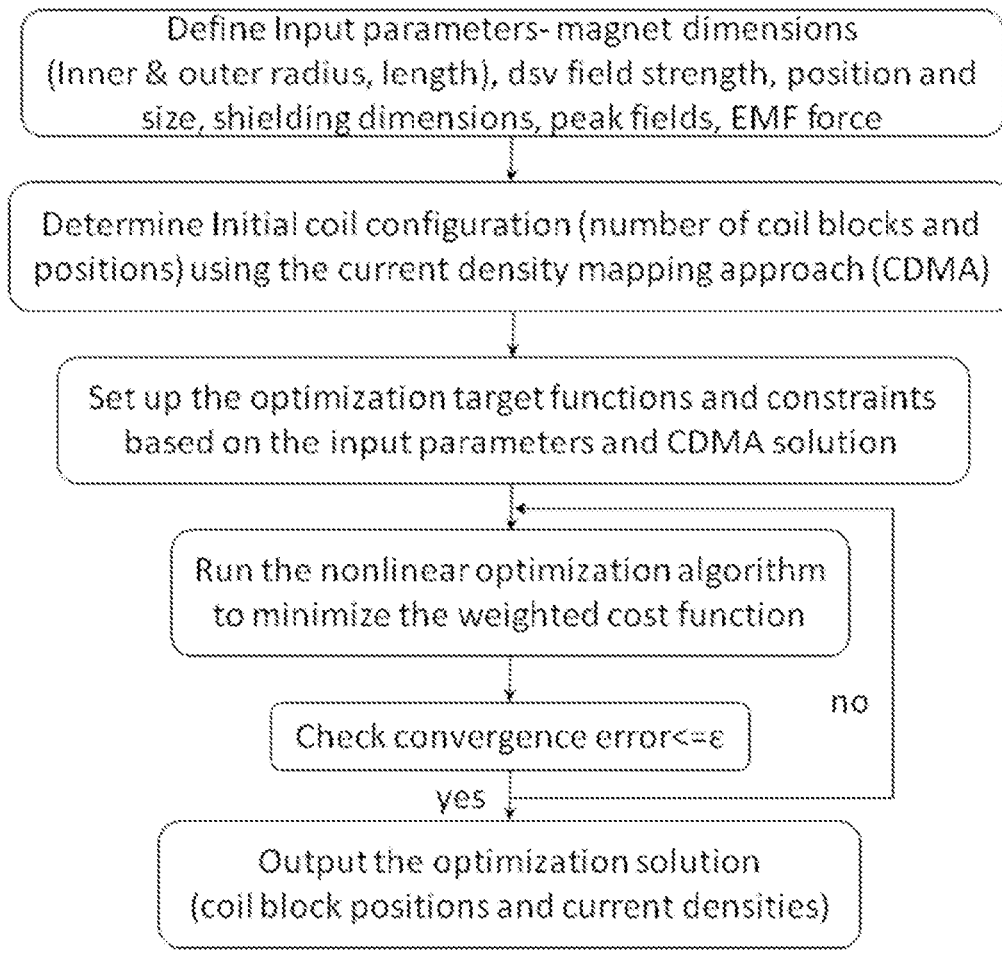
FIG. 4 is a flowchart illustrating the process suitable for designing the magnets of FIGS. 1-2.

The coil positions were determined in an optimization process (see FIG. 4). The optimization was performed using a constrained numerical optimization technique based on a nonlinear least-square algorithm (see, for example, Matlab optimization toolbox, http://www.mathworks.com). The routine used the geometry and positions of the field generating elements as parameters and the error terms mentioned above to calculate the final coil geometry for the magnet.

Example 1 (3.0 T Magnet)

Figure 5:
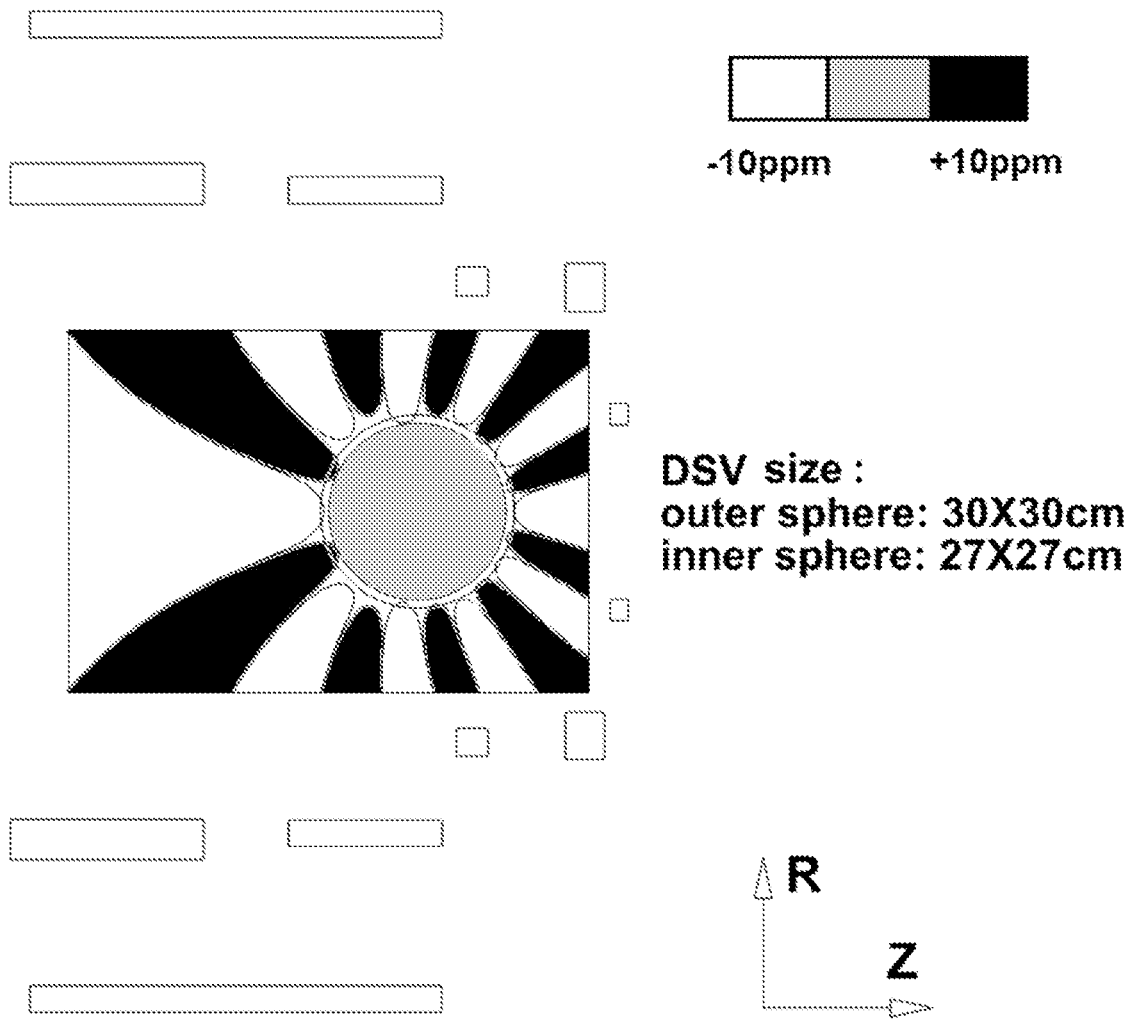
FIG. 5 schematically shows the coil configuration and dsv size of a 3 T magnet example for the first embodiment.

FIG. 5 schematically illustrates a superconducting magnet according to a first embodiment of the present invention. The magnet employs five primary coils (two coils at the first former segment, two other coils at the second former segment and one at the third former segment) and one shield coil. In broad overview, the magnet has a cold bore length of approximately 0.92 meters and a cold bore largest inner radius and smallest inner radius of approximately 0.46 and 0.13 meters, respectively. The magnet has a dsv which is approximately spherical with a diameter of approximately 27 centimetres.

Figure 6:
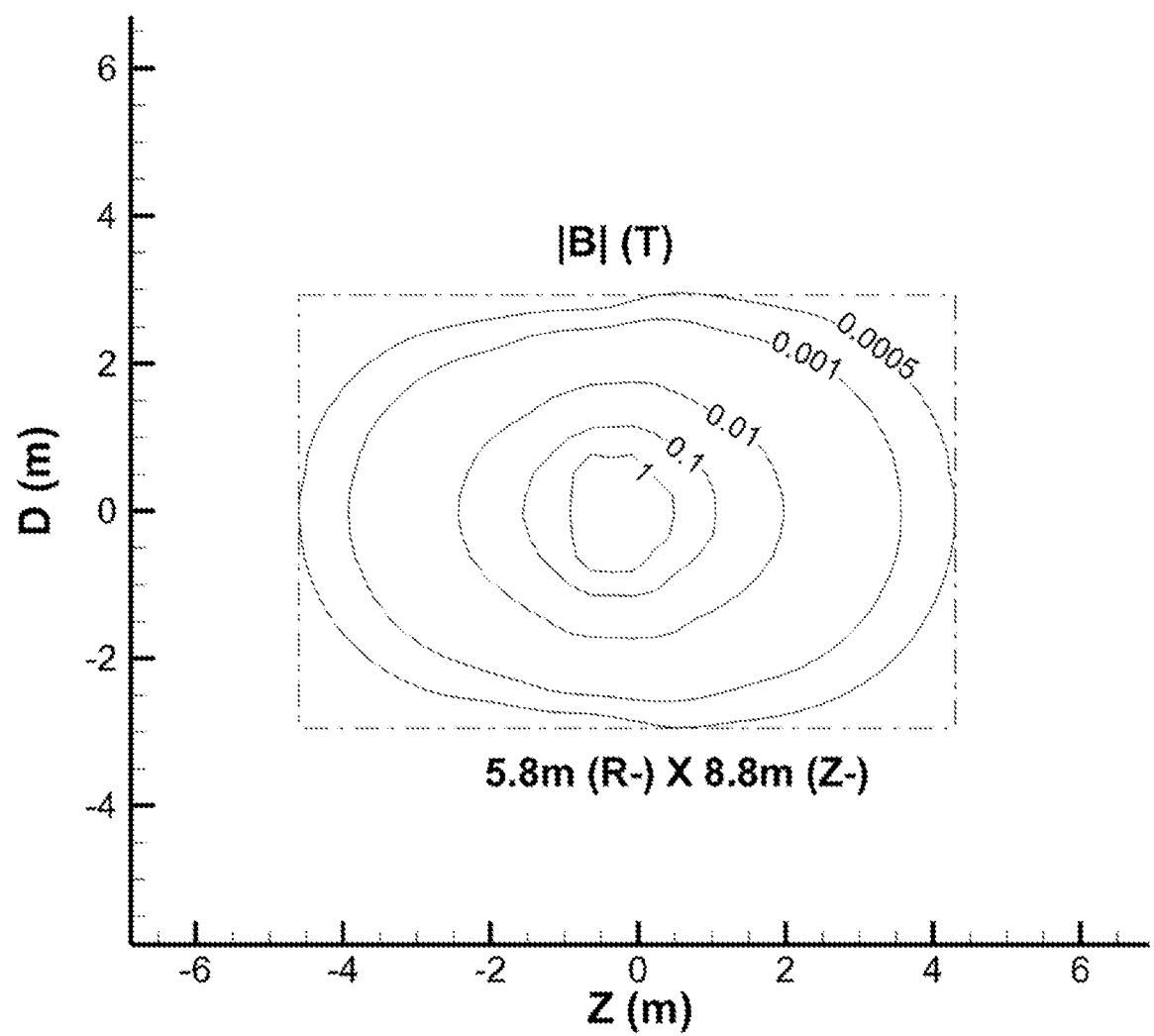
FIG. 6 shows the stray field outside the whole-body magnet of FIG. 5, and particularly the 5 gauss ($5 \times 10^{-4}$ Tesla) contours.
Figure 7:
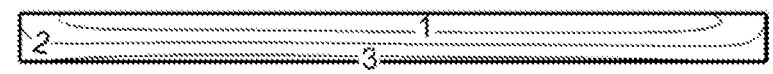
FIG. 7 is a plot showing calculated magnitudes of the total magnetic field within the coils of the whole-body magnet of FIG. 5. The strengths of the fields in Tesla are shown.
Figure 7:
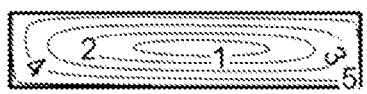
Figure 7:
Figure 7:
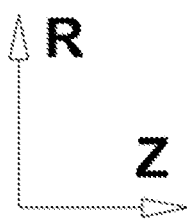
Figure 7:
Figure 7:
Figure 7:
Figure 8:
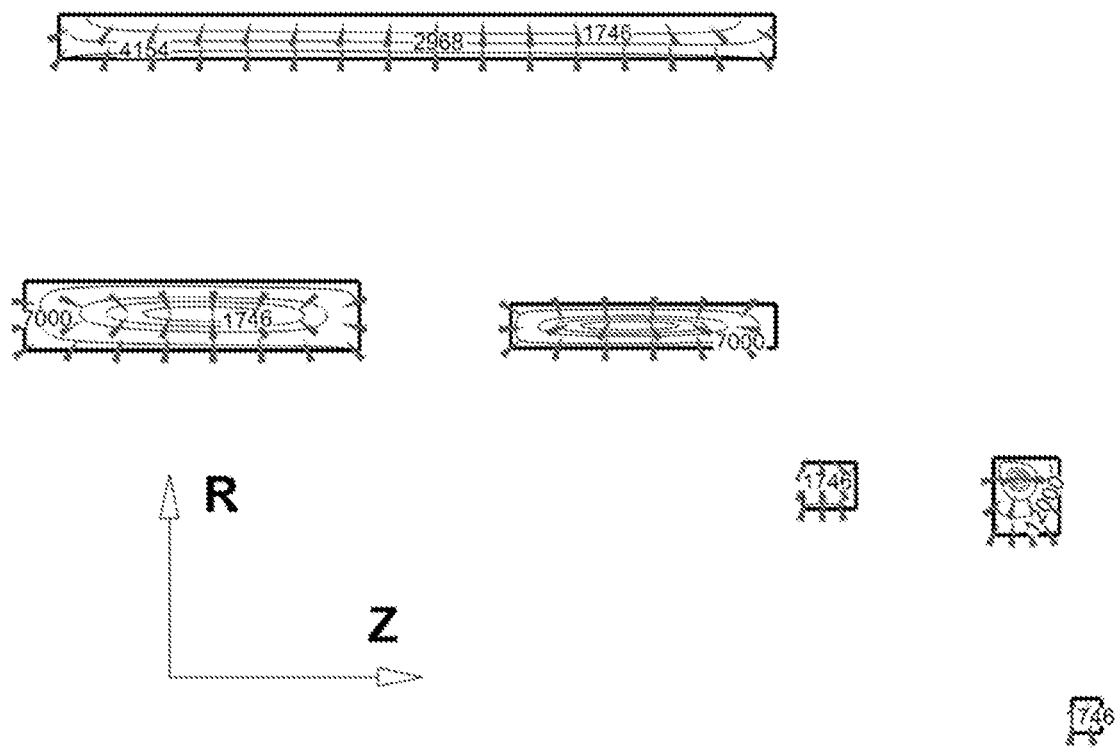
FIG. 8 is a plot showing calculated magnitudes of the total electromagnetic forces within the coils of the whole-body magnet of FIG. 5. The strengths of the forces in Newton are shown.
Figure 9:
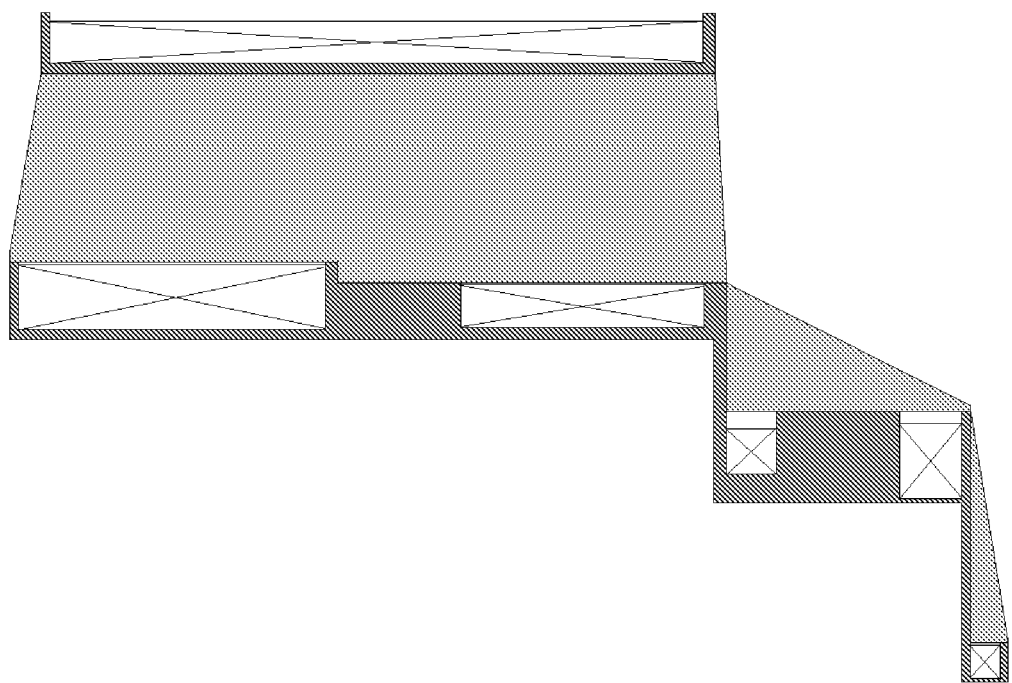
FIG. 9 is a schematic of the former structure of the first embodiment.

FIG. 5 shows the magnet and the field within the dsv. FIG. 6 shows the calculated stray external fields and axial magnetic field generated by the magnet. FIG. 7 shows the calculated magnitudes of the total magnetic field generated by the magnet within the magnet's various coils. FIG. 8 shows the calculated magnitudes of the total electromagnetic forces generated by the magnet within the magnet's various coils. FIG. 9 shows the schematic former structure applicable to this magnet.

As shown in FIG. 6, the magnet also has a 5 Gauss line which is within about 4.4 meters of the centre of the dsv, being approximately 4.4 m axially and 2.9 m radially. As shown in FIG. 7, the peak calculated magnetic field is about 6 Tesla, which allows the magnet to be constructed using readily available superconducting wire.

Example 2 (1.5 T Magnet)

Figure 10:
FIG. 10 schematically shows the coil configuration and dsv size of a 1.5 T magnet example for the second embodiment.
Figure 10:
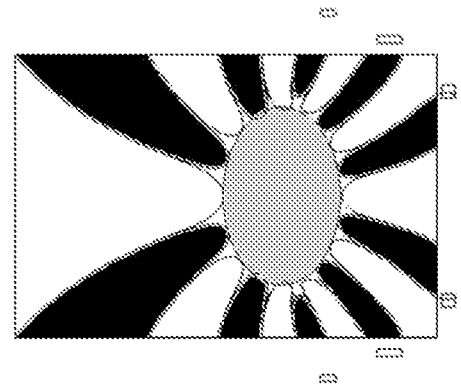
Figure 10:

FIG. 10 schematically illustrates a 1.5 T superconducting magnet design using a structure according to a second embodiment of the invention.

The magnet employs five primary coils (two coils at the first former segment, two other coils at the second former segment and one at the third former segment) and two shield coils. In broad overview, the magnet has a cold bore length of approximately 0.78 meters and a cold bore largest inner radius and smallest inner radius of approximately 0.45 and 0.16 meters, respectively. The magnet has a dsv which is approximately elliptical with an axial diameter of approximately 20 centimetres and a radial diameter of approximately 30 centimetres.

Figure 11:
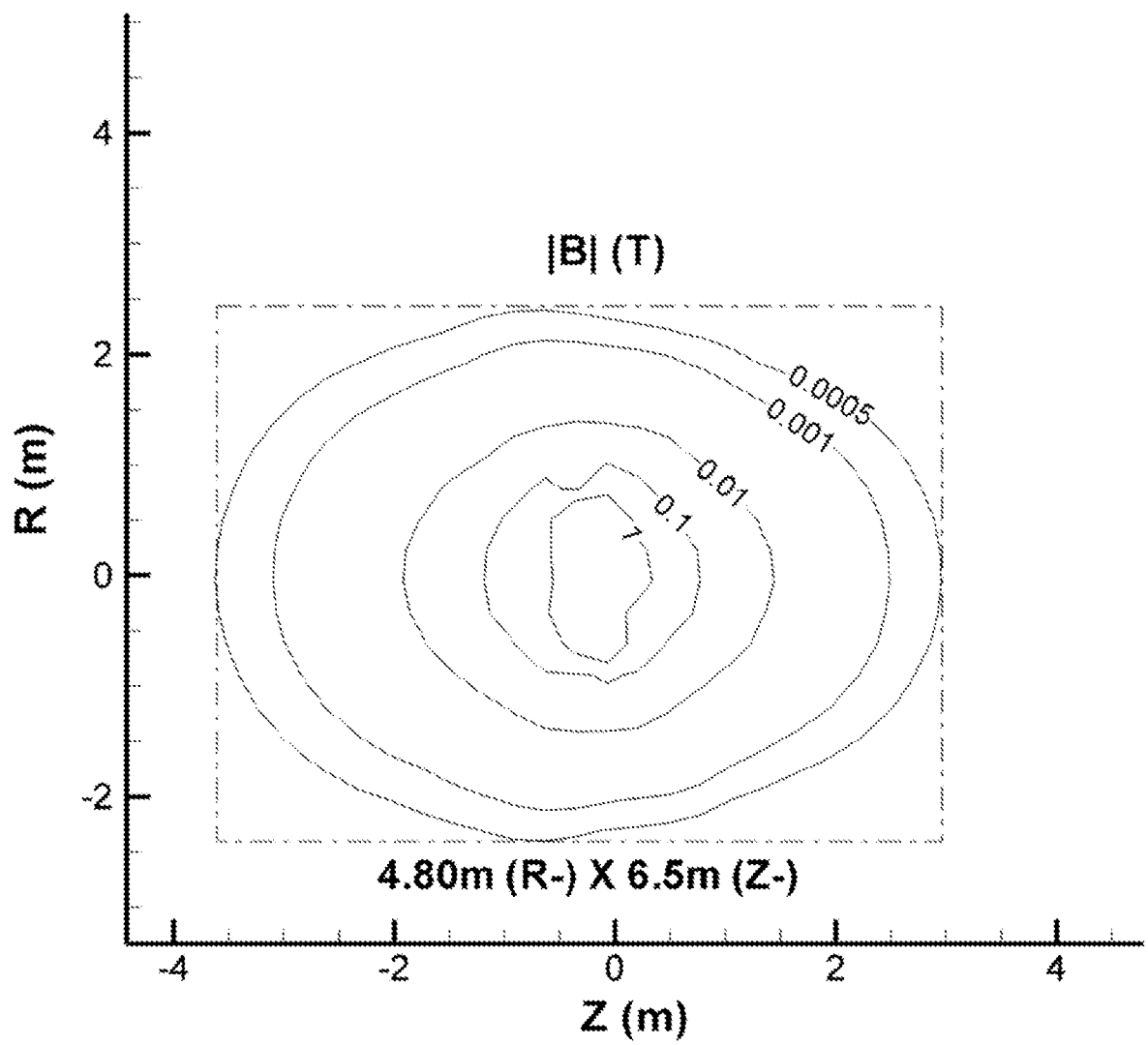
FIG. 11 shows the stray field outside the whole-body magnet of FIG. 10, and particularly the 5 gauss ($5 \times 10^{-4}$ Tesla) contours.
Figure 12:
FIG. 12 is a plot showing calculated magnitudes of the total magnetic field within the coils of the whole-body magnet of FIG. 10. The strengths of the fields in Tesla are shown.
Figure 12:
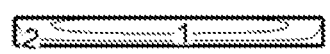
Figure 12:
Figure 12:
Figure 12:
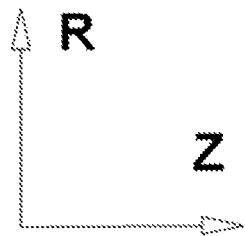
Figure 13:
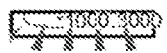
FIG. 13 is a plot showing calculated magnitudes of the total electromagnetic forces within the coils of the whole-body magnet of FIG. 10. The strengths of the forces in Newton are shown.
Figure 13:
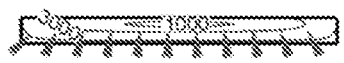
Figure 13:
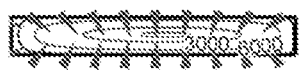
Figure 13:
Figure 13:
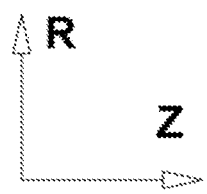
Figure 13:
Figure 13:
Figure 13:
Figure 14:
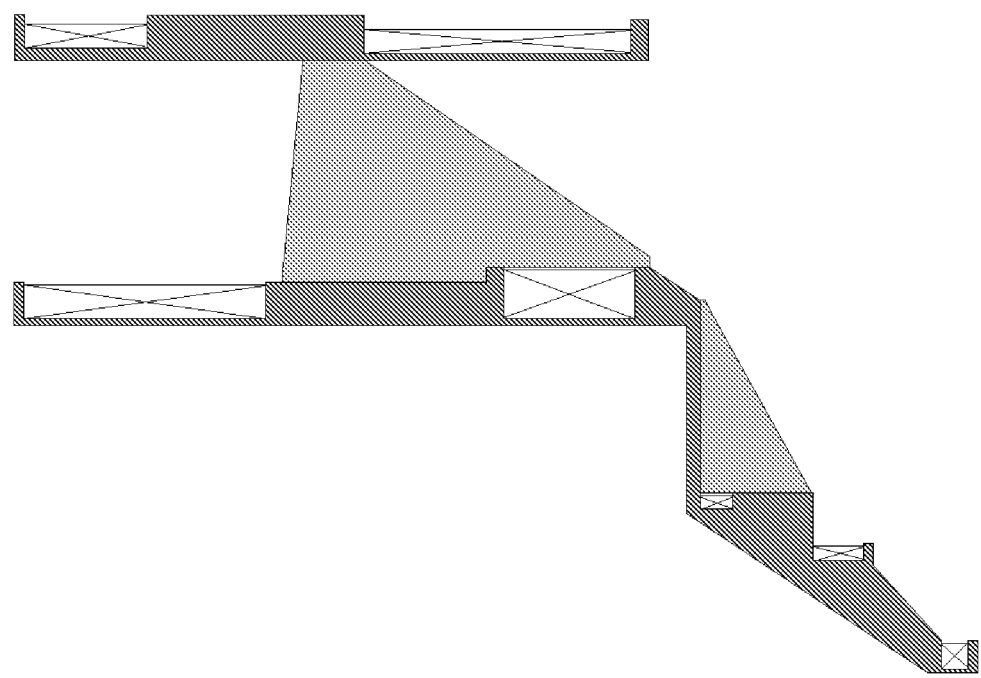
FIG. 14 is a schematic of the former structure of the second embodiment.

FIG. 10 shows the magnet and the field within the dsv. FIG. 11 shows the calculated stray external fields and axial magnetic field generated by the magnet. FIG. 12 shows the calculated magnitudes of the total magnetic field generated by the magnet within the magnet's various coils. FIG. 13 shows the calculated magnitudes of the total electromagnetic forces generated by the magnet within the magnet's various coils. FIG. 14 shows the schematic former structure applicable to this magnet.

As shown in FIG. 11, the magnet has a 5 Gauss line which is within about 3.25 meters of the centre of the dsv, being approximately 3.25 m axially and 2.4 m radially. As shown in FIG. 12, the peak calculated magnetic field is about 4.2

Tesla, which allows the magnet to be constructed using readily available superconducting wire.

The foregoing embodiments are intended to be illustrative of the invention, without limiting the scope thereof. The invention is capable of being practised with various modifications and additions as will readily occur to those skilled in the art.

Where suitable or appropriate, one or more features of one embodiment may be used in combination with one or more features of another embodiment.

The invention claimed is:

1. A superconducting magnet suitable for use in a MRI system, the magnet having a stepped-diameter bore having at least a first, second and third bore section, each bore section having a different diameter to the other bore sections, the bore extending along an axis of the magnet and configured to produce a magnetic field of at least 1.5 Tesla in an imaging region within the first and second bore sections centered along the axis of the magnet, the magnet comprising a primary coil structure having at least first, second and third sets of cons positioned along the axis and coaxially aligned along the axis, each set of coils having one or more primary coils arranged around the bore and each set of coils having a different inner diameter to the other sets, wherein
   a primary coil in the first set is located adjacent to a first axial end of the magnet, a primary coil in the third set is located adjacent to a second axial end of the magnet being opposite to the first axial end, and the second set of coils is located between the first and third sets of coils, and
   the inner diameter of each coil of the second set is less than the inner diameter of each coil of the first set but greater than the inner diameter of each coil of the third set, and
   wherein each of the first, second and third sets of coils are arranged on first, second and third former portions, respectively, surrounding the first, second and third bore sections, respectively,
   and wherein the second former portion has an average inside diameter which is less than the inside diameter of the first former portion but greater than the inside diameter of the third former portion.

2. The magnet of claim 1, wherein the total length of the second and third sets of coils along the axis is less half the length of first set of coils along the axis.

3. The magnet of claim 1, further comprising a plurality of circumferentially spaced first reinforcing portions each connected between the first former portion and the second former portion.

4. The magnet of claim 1, further comprising a plurality of circumferentially spaced second reinforcing portions each connected between the second former portion and the third former portion.

5. The magnet of claim 3, wherein the reinforcing portions are in the form of triangular plates.

6. The magnet of claim 1, further comprising a shielding coil structure having at least one shielding coil of greater diameter than all the primary coils, the shielding coil structure being located radially outwardly of the primary coils and extending approximately the axial length of the first former portion of the magnet.

7. The magnet of claim 6, wherein the shielding coil has opposite current polarity to the majority of the primary coils.

8. The magnet of claim 6, further comprising a plurality of circumferentially spaced first reinforcing portions each connected between the first former portion and the shielding coil structure.

9. The magnet of claim 1, further comprising an outer vacuum chamber located radially outwardly of the primary coil structure, the outer vacuum chamber being formed between a larger diameter cylindrically-shaped portion and a smaller diameter conical or frusto-conical shaped portion.

10. The magnet of claim 1, wherein a ratio of the inner diameter of each coil of the first set to the inner diameter of each coil of the third set is greater than 2.

11. The magnet of claim 1, wherein the inner diameter of each coil of the third set is less than 40 cm.

12. The magnet of claim 1, wherein the inner diameter of each coil of the first set is between 80 cm and 110 cm.

13. The magnet of claim 1, wherein at least the first former portion is of cylindrical shape.

14. The magnet of claim 1, wherein the second former portion is of conical or frusto-conical shape.

15. The magnet of claim 1, wherein the magnet has a cold bore axial length less than 100 cm.

16. The magnet of claim 1, wherein the dimension of the imaging region in the axial direction is at least 20 cm.

17. The magnet of claim 1, further comprising a two-step gradient coil structure having a first gradient coil of a first diameter located within the first former portion, and a second gradient coil of a second diameter located within the second former portion, the first diameter being greater than the second diameter.

18. A magnetic resonance imaging system having a magnet as claimed claim 1.

19. A method of designing a magnet as claimed in claim 1, wherein the method comprises a step of force balancing to minimize the net forces on at least the axial end coils in the primary coil structure.

20. A method of designing a magnet as claimed in claim 19, wherein the step of force balancing includes Maxwell forces in an error function to be minimized.

* * * * *